(12) United States Patent
England et al.

(10) Patent No.: US 8,304,888 B2
(45) Date of Patent: Nov. 6, 2012

(54) INTEGRATED CIRCUIT PACKAGE WITH EMBEDDED COMPONENTS

(75) Inventors: Luke England, Portland, ME (US); Douglas Hawks, Escondido, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 272 days.

(21) Appl. No.: 12/645,075

(22) Filed: Dec. 22, 2009

(65) Prior Publication Data

US 2011/0147917 A1 Jun. 23, 2011

(51) Int. Cl.
*H01L 23/538* (2006.01)

(52) U.S. Cl. . 257/692; 257/712; 257/724; 257/E21.502; 257/E21.509; 257/E23.141; 257/E23.169; 438/122

(58) Field of Classification Search .................. None
See application file for complete search history.

(56) References Cited

U.S. PATENT DOCUMENTS

| | | | |
|---|---|---|---|
| 5,191,405 A | 3/1993 | Tomita et al. | |
| 5,579,207 A | 11/1996 | Hayden et al. | |
| 6,034,441 A * | 3/2000 | Chen | 257/787 |
| 6,682,955 B2 | 1/2004 | Cobbley et al. | |
| 6,879,493 B2 * | 4/2005 | Kimura et al. | 361/763 |
| 7,250,576 B2 * | 7/2007 | Colgan et al. | 174/260 |
| 7,291,869 B2 * | 11/2007 | Otremba | 257/107 |
| 7,312,405 B2 * | 12/2007 | Hsu | 174/262 |
| 7,501,702 B2 * | 3/2009 | Joshi et al. | 257/724 |
| 2004/0188811 A1 * | 9/2004 | Vandentop et al. | 257/678 |
| 2005/0207133 A1 * | 9/2005 | Pavier et al. | 361/761 |
| 2006/0289976 A1 * | 12/2006 | Min | 257/678 |
| 2007/0251721 A1 * | 11/2007 | Kiuchi et al. | 174/258 |
| 2007/0290378 A1 * | 12/2007 | Coffin et al. | 257/791 |
| 2008/0038528 A1 * | 2/2008 | Paul | 428/219 |
| 2008/0088038 A1 * | 4/2008 | Hsu et al. | 257/786 |
| 2008/0217708 A1 * | 9/2008 | Reisner et al. | 257/416 |
| 2008/0265411 A1 * | 10/2008 | Hu | 257/737 |
| 2009/0174046 A1 | 7/2009 | Liu et al. | |
| 2009/0230537 A1 | 9/2009 | Liu et al. | |
| 2009/0278241 A1 | 11/2009 | Liu et al. | |
| 2010/0123257 A1 | 5/2010 | Liu | |
| 2010/0155915 A1 * | 6/2010 | Bell et al. | 257/676 |

FOREIGN PATENT DOCUMENTS

| | | | |
|---|---|---|---|
| CN | 102142415 A | | 8/2011 |
| JP | 2004-104115 | * | 4/2004 |
| JP | 2005-183500 | * | 7/2005 |

OTHER PUBLICATIONS

Machine translation for JP 2004-104115.*

(Continued)

*Primary Examiner* — Fernando L Toledo
*Assistant Examiner* — Victoria K Hall
(74) *Attorney, Agent, or Firm* — Schwegman, Lundberg & Woessner, P.A.

(57) ABSTRACT

This document discusses, among other things, a semiconductor die package having a first and a second discrete components embedded into a dielectric substrate. An integrated circuit (IC) die is surface mounted on a first side of the dielectric substrate. The semiconductor die package includes a plurality of conductive regions on the second side of the dielectric substrate for mounting the semiconductor die package. A plurality of through hole vias couple the IC die to the first and second discrete components and the plurality of conductive regions.

20 Claims, 5 Drawing Sheets

OTHER PUBLICATIONS

Machine translation for JP 2005-183500.*

Barnat, Samed, et al., "Virtual prototyping of a Wafer Level Chip Scale Package: Underfill role in die cracking", *10th International Conference on Thermal, Mechanical and Multi-Physics simulation and Experiments in Microelectronics and Microsystems, 2009. EuroSimE 2009.*, (2009), 1-6.

Sakuma, K, et al., "Characterization of stacked die using die-to-wafer integration for high yield and throughput", *58th Electronic Components and Technology Conference, 2008. ECTC 2008.*, (May 2008), 18-23.

Takamiya, M., et al., "3D-structured on-chip buck converter for distributed power supply system in SiPs", *IEEE International Conference on Integrated Circuit Design and Technology and Tutorial, 2008. ICICDT 2008.*, (Jun. 2008), 4 pgs.

Yang, Daoguo, et al., "Reliability modeling on a MOSFET power package based on embedded die technology", *10th International Conference on Thermal, Mechanical and Multi-Physics simulation and Experiments in Microelectronics and Microsystems, 2009. EuroSimE 2009.*, (2009), 1-6.

* cited by examiner

INTEGRATED CIRCUIT PACKAGE WITH EMBEDDED COMPONENTS

BACKGROUND

Electronic devices, such as cell phones, personal data assistants, digital cameras, laptops, etc., generally include several packaged semiconductor integrated circuit (IC) chips and surface mount components assembled onto interconnect substrates. There is continual market demand to incorporate more functionality and features into electronic devices, while simultaneously decreasing the size of the electronic devices. This, in turn, has placed increasing demands on the design, size, and assembly of interconnect substrates. As the number of assembled components increases, substrate areas and costs increase, while demand for smaller form factor increases.

OVERVIEW

This document discusses, among other things, a semiconductor die package having a first and a second discrete component embedded into a dielectric substrate. An integrated circuit (IC) die is surface mounted or wire bonded on a first side of the dielectric substrate. The semiconductor die package includes a plurality of conductive regions on the second side of the dielectric substrate for mounting the semiconductor die package. A plurality of through hole vias couple the IC die to the first and second discrete components and the plurality of conductive regions.

This overview is intended to provide a brief review of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a compact IC package having a first and a second discrete components embedded in a dielectric substrate. An IC die is mounted to the dielectric substrate and coupled to the first and the second discrete components. A plurality of through hole vias are disposed within the dielectric substrate for coupling the IC die and the first and second discrete components to each side of the dielectric substrate. An electrically insulating material is disposed over the IC and the dielectric substrate to form the IC package. The dielectric substrate can include a plurality of bond pads on a side opposite the IC die.

Figure 1:
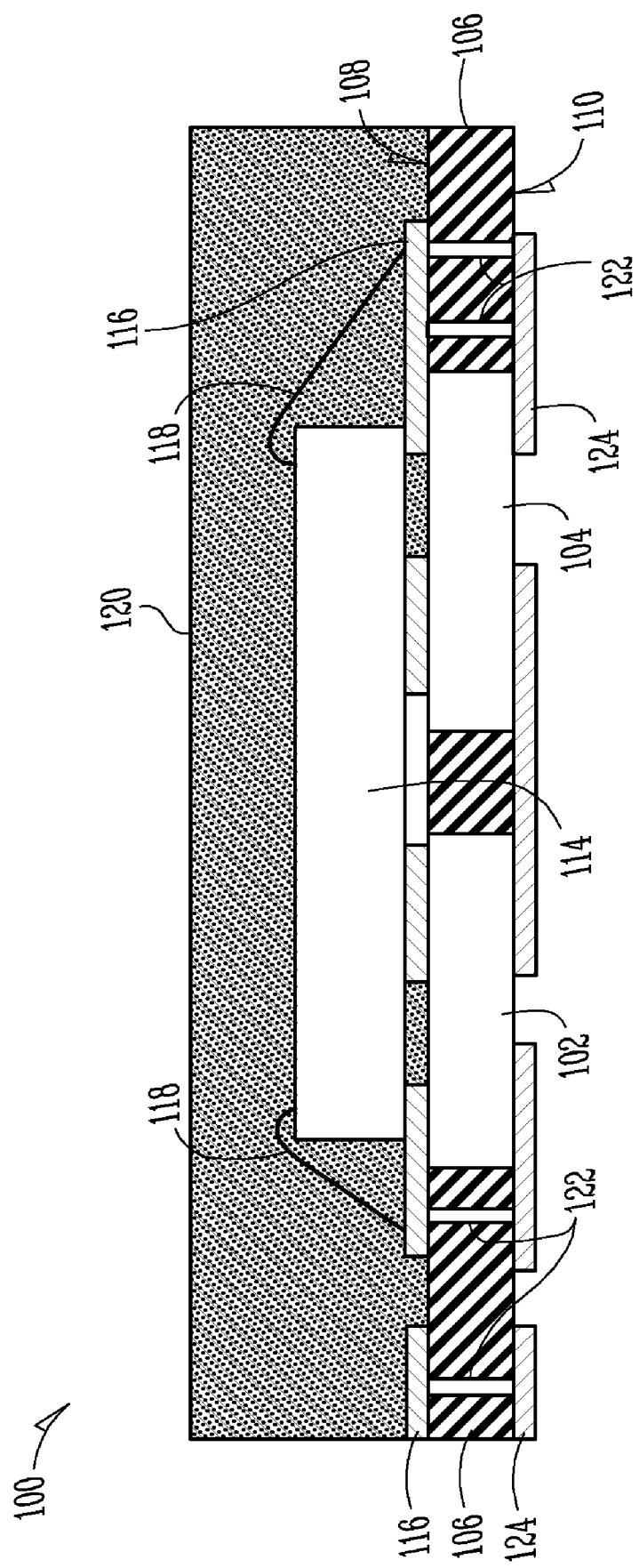
FIG. 1 illustrates generally a cross-sectional view of an example of an IC package having a plurality of components embedded in a substrate with an IC die mounted thereon.

FIG. 1 illustrates generally a cross-sectional view of one embodiment of an IC package 100. IC package 100 includes a first discrete component 102 and a second discrete component 104 embedded in a dielectric substrate 106. In an example, the dielectric substrate 106 can include a prepreg material. The dielectric substrate 106 includes a first side 108 and a second side 110. In an example, the first and second discrete components 102, 104 are adjacent to one another within the dielectric substrate 106.

In an example, the dielectric substrate 106 can include a first patterned conductive layer 116 on the first side 108 of the dielectric substrate 106. The first patterned conductive layer 116 can include a plurality of conductive traces. The conductive traces are formed from metal sheets (e.g., copper) that are laminated onto the first side 108 of the dielectric substrate 106 and then etched to form a pattern of conductive traces. In an example, the first patterned conductive layer 116 and the first side 108 of the dielectric substrate 106 are then covered with a solder mask. The solder mask selectively exposes conductive regions (e.g. bond pads or pads) of the first patterned conductive layer 116 for electric and physical coupling of an IC die 114 thereon. In an example, a portion of the exposed conductive regions are dummy pads for physical coupling of the IC die. The dummy pads are not electrically coupled to either a through hole via 122 or the first or second discrete components 102, 104. In an example, the combination of the dielectric substrate 106, the first patterned conductive layer 116 and the solder mask can form a printed circuit board.

The IC die 114 is mounted on the first side 108 of the dielectric substrate 106 and electrically coupled to the first patterned conductive layer 116 at the plurality of exposed conductive regions. In an example, the IC die 114 is wirebond connected to the first patterned conductive layer 116 with a plurality of interconnect wires 118. The plurality of wires 118 are coupled from pads on the IC die 114 to pads of the first patterned conductive layer 116. In an alternative example, the IC die 114 is flip chip mounted to the first patterned conductive layer 116 with a plurality of solder balls or other flip chip interconnect material.

In an example, the IC die 114 and the first side 108 of the dielectric substrate 106 are covered with an electrically insulating material 120. The electrically insulating material 120 electrically insulates the IC die 114 from external influences. In an example, the electrically insulating material 120 can include a mold compound such as an epoxy, a silicone, a polyimide, or a combination of one or more of these materials.

In an example, a second patterned conductive layer 124 is mounted on the second side 110 of the dielectric substrate 106 in a similar manner as described for the first side 108. The second patterned conductive layer 124 can include a plurality conductive traces. The conductive traces are formed from metal sheets (e.g., copper) that are laminated onto the second side 110 of the dielectric substrate 106 and then etched to form a pattern of conductive traces. In an example, the second patterned conductive layer 124 and the second side 110 of the dielectric substrate 106 are then covered with a solder mask.

The solder mask selectively exposes conductive regions (e.g., input-output (IO) pads) of the second patterned conductive layer 124 for electric and physical coupling of the IC package 100 to an external interconnect substrate (e.g. another printed circuit board). In an example, a portion of the exposed conductive regions are dummy pads for physical coupling of the IC package 100. The dummy pads are not electrically coupled to either a through hole via 122 or the first or second discrete components 102, 104.

In an example, a plurality of through hole vias 122 are disposed within the dielectric substrate 106 for electrically coupling the first patterned conductive layer 116 to the second patterned conductive layer 124. The plurality of through hole vias 122 provide electrical coupling between the IC die 114 and the plurality of contact regions on the second side 110 of the dielectric substrate 106. In an example, the plurality of through hole vias 122 also provide electrical coupling for areas coupled to the first and second discrete components 102, 104 on the first patterned conductive layer 116 to the second patterned conductive 124.

The combined package of the dielectric substrate 106 with the embedded discrete components 102, 104 and the IC die 114 mounted thereon forms a compact IC package 100 that can be surface mounted to an external interconnect substrate via the exposed conductive regions on the second side 110 of the dielectric substrate 106.

Embedding the first and second discrete components 102, 104 within the dielectric substrate 106 can provide reduced size for the IC package 100 and can provide reduced interconnect lengths between the discrete components 102, 104 and the IC die 114. In an example, the first and second discrete components 102, 104 can be embedded in the dielectric substrate 106 such as by the embedding process developed by Imbera Electronics of Finland or AT&S of Austria.

Briefly, one or more dies (e.g., the first discrete component 102) can be embedded in a dielectric substrate by first attaching the die(s) to a conductive layer. A prepreg material is then placed around the die(s) thereby embedding the die(s) into the prepreg material. The prepreg material can include a precut hole for the die(s), and the prepreg material can be placed around the die(s) and onto the conductive layer.

Then a second conductive layer can then be placed on the prepreg material and the resulting construction of prepreg with conductive layers on either side and die(s) embedded can be laminated together. Once the die(s) is embedded into the dielectric substrate, the through hole vias are formed. Holes for the through hole vias can be drilled through the dielectric substrate and the layers laminated thereon. A metal (e.g., copper) is deposited within the holes. The IC die (e.g., IC die 114) can be mounted onto the appropriate side of the dielectric substrate strip array having the embedded die(s) therein. The interconnect wires coupling the IC die to exposed conductive portions on the dielectric substrate can then be added and the IC die can be covered with an electrically insulating material (e.g., electrically insulating material 120) which is cured on thereon to form an array of IC packages 100. The IC package array can then be mechanically sawn to isolate individual IC packages 100 from one another.

Figure 2:
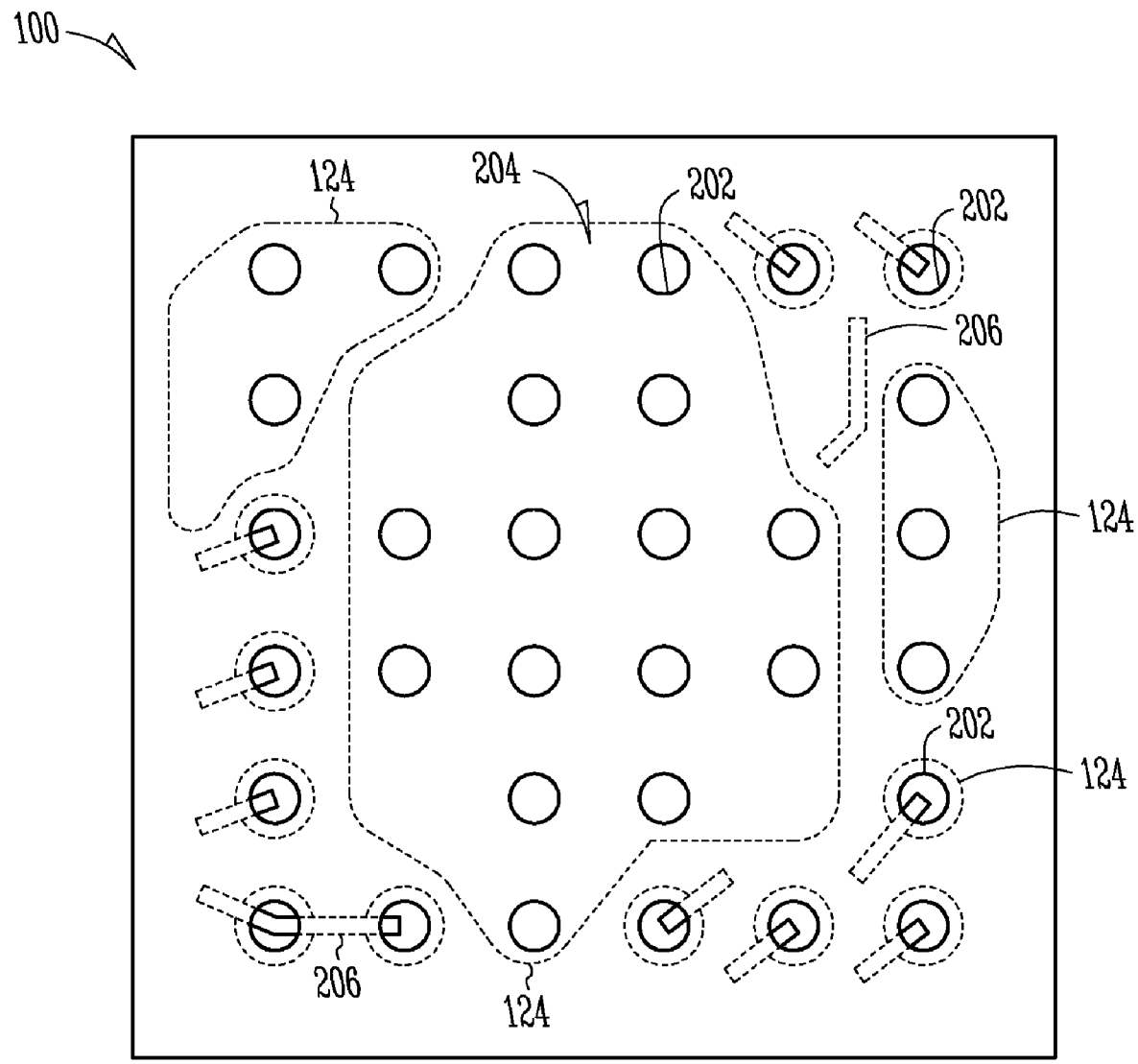
FIG. 2 illustrates generally a first bottom view of the IC package of FIG. 1 showing a patterned conductive layer and a plurality of exposed conductive regions for coupling of the IC package of FIG. 1 to an external interconnect substrate.

FIG. 2 illustrates an example of a first cross-sectional view of the second side 110 of the dielectric substrate 106 of FIG. 1. FIG. 2 shows the second side 110 of the dielectric substrate 106 looking up from the bottom with respect to the orientation shown in FIG. 1. FIG. 2 illustrates the second patterned conductive layer 124 and the plurality of conductive regions 202 exposed by the solder mask. The plurality of conductive regions 202 are generally regularly spaced across the second side 110 of the dielectric substrate 106 and are illustrated as circles in FIG. 2. In an example, the second patterned conductive layer can include large planar portions, shown generally at 204, and a plurality of traces 206. The large planar portions 204 can provide good thermal conduction and/or improved electrical performance for elements (e.g., the first discrete component 102) coupled thereto. The plurality of traces 206 couple elements or through hole vias 122 to an exposed conductive region 124.

Figure 3:
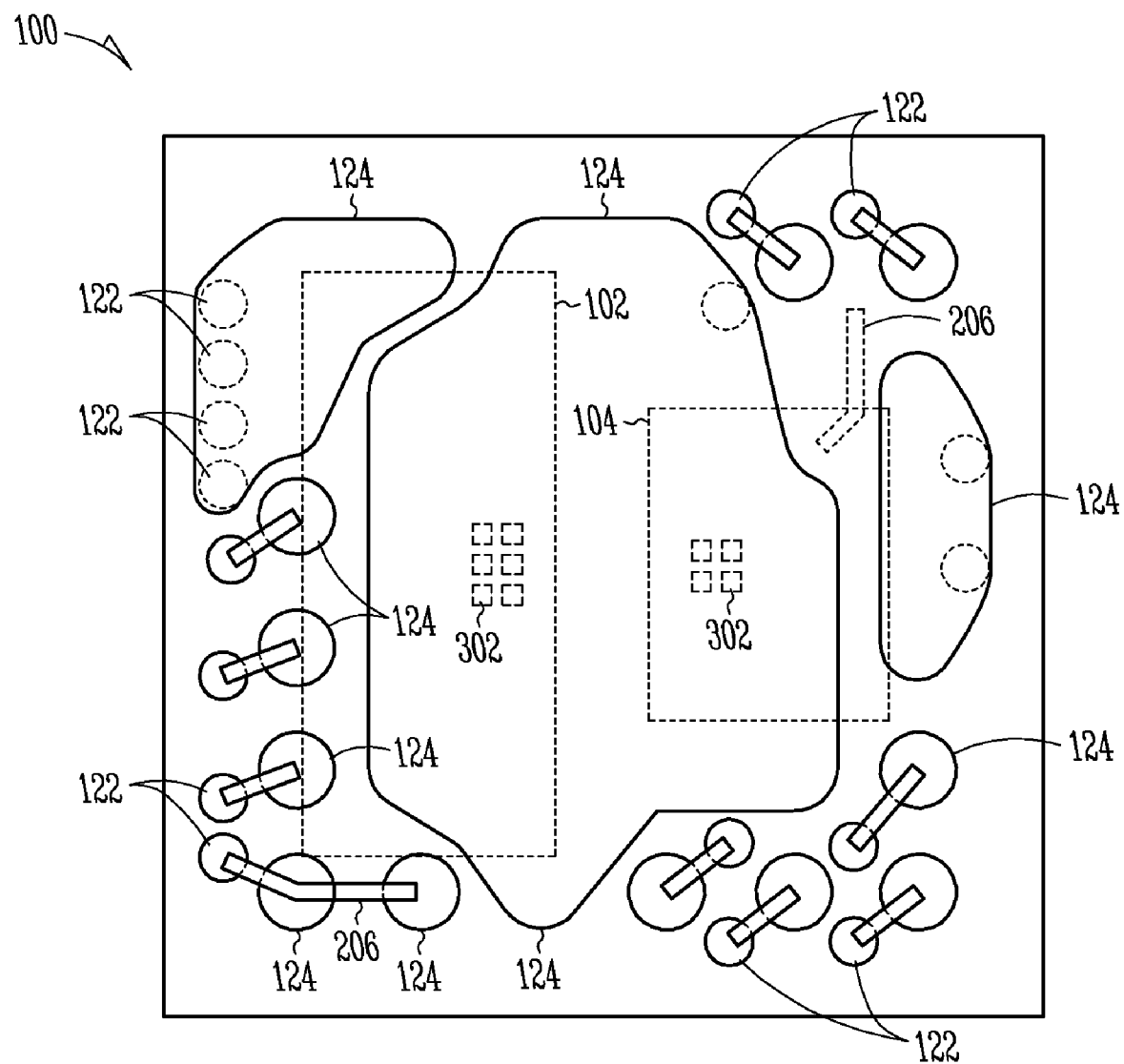
FIG. 3 illustrates generally a second bottom view of the IC package of FIG. 1 showing a patterned conductive layer, a plurality of through hole vias, and the positioning of the embedded components.

FIG. 3 illustrates an example of a second cross-sectional view of the second side 110 of the dielectric substrate 106 of FIG. 1. FIG. 3 shows the second patterned conductive layer 124 as well as the plurality of through hole vias 122 and placement of the first and second discrete components 102, 104 embedded in the dielectric substrate 106.

As shown, the traces 206 can couple to a through hole via 122 or the trace 206 can couple to a discrete component (e.g. the second discrete component 104). In FIG. 3 the through hole vias 122 are shown as smaller circles. The larger circles are portions of the patterned conductive layer 124. In an example, the majority of the through hole vias 122 can be positioned toward the outer edges of the dielectric substrate 106. Advantageously, positioning the through hole vias 122 toward the outer edges of the dielectric substrate 106 can provide efficient layout of the first and second discrete component 102, 104 embedded in the dielectric substrate 106. In other examples, however, some or all of the through hole vias 122 can be positioned in between the first and second discrete components 102, 104.

FIG. 3 illustrates the positioning of the first and second discrete components 102, 104 underneath the second patterned conductive layer 124. In an example, a plurality of openings 302 in the second side 110 of the dielectric substrate 106 provide electric and thermal coupling of the first and second discrete components 102, 104 to a large plane of the second patterned conductive layer 124. Although a certain number of openings 302 in the dielectric substrate 106 are shown, in certain examples, more or less openings 302 can be provided. In an example, the number of openings 302 can be increased from that shown in FIG. 3 in order to provide increased electrical and thermal coupling to the first and second discrete components 102, 104.

Figure 4:
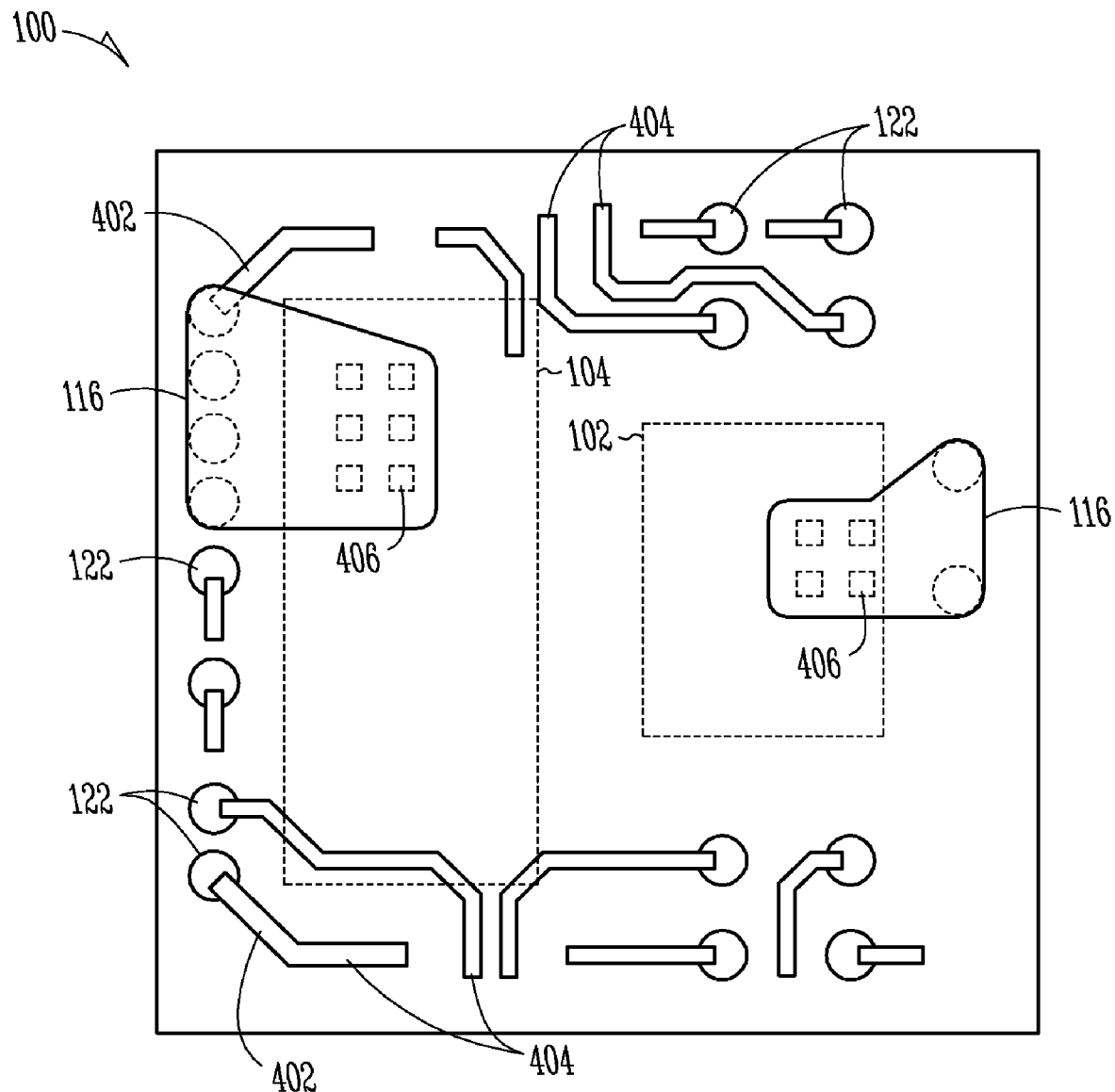
FIG. 4 illustrates generally a first top view of the IC package of FIG. 1 showing a patterned conductive layer, a plurality of through hole vias and the positioning of the embedded components.

FIG. 4 illustrates an example of a first cross-sectional view of the first side 108 of the dielectric substrate 106 of FIG. 1. FIG. 4 shows the first patterned conductive layer 116, the plurality of through hole vias 122, and the first and second discrete components 102, 104 embedded in the dielectric substrate 106. FIG. 4 illustrates the positioning of the first and second discrete components 102, 104 underneath the first patterned conductive layer 116.

The first patterned conductive layer 116 includes a plurality of traces 402 for electrically coupling the through hole vias 122 to the discrete components (e.g. first discrete component 102) and to exposed conductive regions 404 (e.g., pads) for coupling of wires from the IC die 114. In FIG. 4, the through hole vias 122 are shown as circles. The first patterned conductive layer 116 can also include larger regions for coupling to the first and second discrete components 102, 104. The larger regions are coupled to the first and second discrete components 102, 104 with openings 406 in the first side 108 of the dielectric substrate 106. Although a certain number of openings 406 in the dielectric substrate 106 are shown, in certain examples, more or less openings 406 can be provided. In an example, the number of openings 406 can be increased from that shown in FIG. 3 in order to provide increased electrical and thermal coupling to the first and second discrete components 102, 104.

Figure 5:
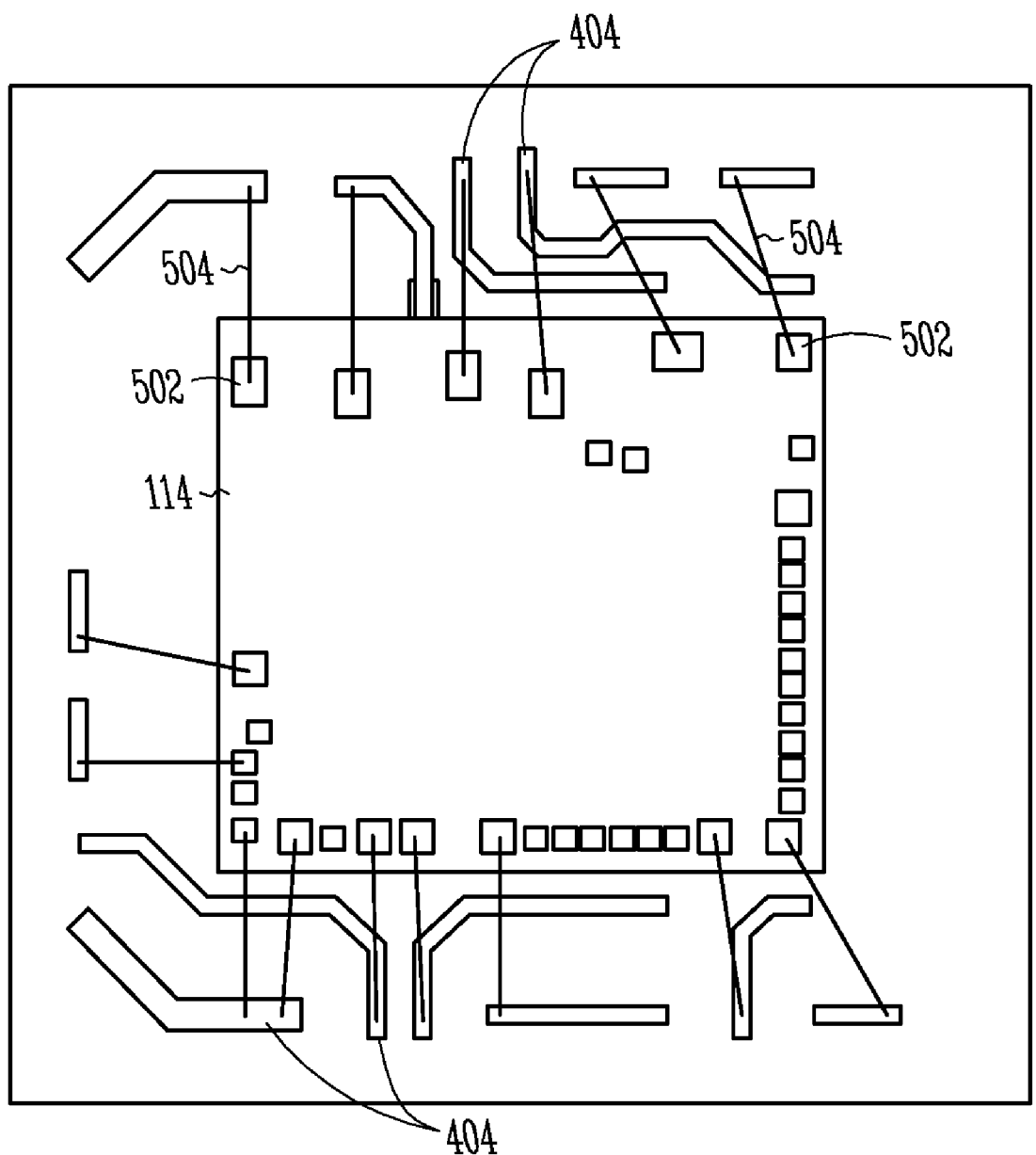
FIG. 5 illustrates generally a second top view of the IC package of FIG. 1 showing traces of a patterned conductive layer, an IC die, and wires coupling the IC die to the traces.

FIG. 5 illustrates an example of a top view of the first side 108 of the dielectric substrate 106 of FIG. 1. FIG. 5 illustrates the top view of the first side 108 without showing the electrically insulating material 120 for illustrative purposes. FIG. 5 shows the IC die 114 having pads 502 coupled with interconnect wires 504 to exposed conductive portions 404 of the first patterned conductive layer 116.

In an example, the first and second discrete components can include transistors and the IC die 114 can include a controller for the transistors. In particular, the first and second discrete components 102, 104 can include a high-side and a low-side metal oxide semiconductor field effect transistors (MOSFETs) which together with the IC die 114 form a power converter. In a particular example, the power converter can be a buck converter and the first discrete component 102 can include a high-side MOSFET while the second discrete component 104 can include a low-side MOSFET.

In an example, the sources of both the transistors are coupled to a large section of the second patterned conductive layer 124 on the second side 110 of the dielectric substrate 106. The large surface areas coupled to the sources of the transistors can provide good thermal performance due to the large area of heat dissipation available for external bond pad placement (e.g. the plurality of conductive regions).

Advantageously, embedding the first and second discrete components 102, 104 within the dielectric substrate 106 can reduce the size of the IC package 100. Additionally, embedding the first and second discrete components 102, 104 in the dielectric substrate can provide for increased thermal performance as the components generating the majority of the heat (the first and second discrete components 102, 104) are positioned near the external exposed conductive portions 202 to aid in easy removal of heat from the first and second discrete components 102, 104.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Additionally, in this document, when a first element, such as a material or IC die, is referred to as being "on" (e.g. mounted on) a second element, the first element can be directly on the second element, or intervening elements can also be present. In this document, when a first element, such as a layer, a region, or a substrate, is referred to as being "coupled to" a second element, the first element can be directly coupled to the second element, or the one or more intervening elements can be present. In contrast, when a first element is referred to as being "directly on" or "directly coupled to" another element, there are no intervening elements present.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A power converter comprising:
    a dielectric substrate having a first side and a second side opposite the first side;
    a high-side metal-oxide-semiconductor field-effect transistor (MOSFET) die embedded in the dielectric substrate;
    a low-side MOSFET die embedded in the dielectric substrate;
    an integrated circuit (IC) die, having a top and a bottom, the bottom surface mounted on the first side of the dielectric substrate and electrically coupled to the high-side MOSFET die and low-side MOSFET die, wherein, in cross section, the IC die at least partially overlaps each of the high-side MOSFET die and low-side MOSFET die;
    an electrically insulating material disposed on the top of the IC die and at least a portion of the first side of the dielectric substrate;
    a plurality of conductive regions on the second side of the dielectric substrate for mounting of the dielectric substrate, wherein one of the plurality of conductive regions on the second side of the dielectric substrate is electrically coupled to a source of the high-side MOSFET die and to a source of the low-side MOSFET die;
    a plurality of through hole vias disposed within the dielectric substrate, at least one of the plurality of through hole vias electrically coupling the IC die to at least one of the plurality of conductive regions.

2. The power converter of claim 1, wherein the plurality of conductive regions include bond pads for one of: ball grid array mounting or land grid array mounting.

3. The power converter of claim 1, comprising a patterned conductive layer on the first side of the dielectric substrate between the IC die and the dielectric substrate, wherein the IC die, the high side MOSFET die and the low-side MOSFET die, and the plurality of through hole vias are electrically coupled to the patterned conductive layer.

4. The power converter of claim 3, wherein the IC die is flip chip mounted to the patterned conductive layer.

5. The power converter of claim 3, wherein the IC die is wirebond mounted to the patterned conductive layer.

6. The power converter of claim 3, wherein at least one of the plurality of through hole vias and the patterned conductive layer electrically couple the high-side MOSFET die to at least one of the plurality of conductive regions.

7. The power converter of claim 1, comprising a patterned conductive layer on the second side of the dielectric substrate, wherein the patterned conductive layer provides electrical coupling between the first and second discrete components to the high-side MOSFET die and the low-side MOSFET die and the plurality of through hole vias.

8. The power converter of claim 1, wherein the electrically insulating material includes one or more of the following: an epoxy and a silicone.

9. The power converter of claim 1, wherein the IC die includes a controller for controlling operation of the high-side MOSFET die and the low-side MOSFET die.

10. The power converter of claim 1, wherein the dielectric substrate includes a prepreg material.

11. A method comprising:
embedding a high-side metal-oxide-semiconductor field-effect transistor (MOSFET) and a low-side MOSFET in a dielectric substrate, wherein the high-side MOSFET is adjacent to the low-side MOSFET, and wherein dielectric substrate has a first side and a second side opposite the first side;
forming a plurality of through hole vias in the dielectric substrate;
forming a plurality of conductive regions on a first side of the dielectric substrate, wherein at least one conductive region is electrically coupled to at least one of the plurality of through hole vias, and wherein one of the plurality of conductive regions on the first side of the dielectric substrate is electrically coupled to a source of the high-side MOSFET and to a source of the low-side MOSFET;
mounting an integrated circuit (IC) die, having a top and a bottom, on the second side of the dielectric substrate, wherein the IC die is electrically coupled to the high-side MOSFET and low-side MOSFET and at least one through hole via, wherein, in cross section, the IC die at least partially overlaps each of the high-side MOSFET and low-side MOSFET; and
curing an electrically insulating material over the top of the IC die and at least a portion of the second side of the dielectric substrate.

12. The method of claim 11, comprising:
laminating a patterned conductive layer on the second side of the dielectric substrate such that the patterned conductive layer is disposed between the dielectric substrate and the IC die, wherein the IC die and the high-side MOSFET and the low side MOSFET are electrically coupled to the patterned conductive layer.

13. The method of claim 12, wherein mounting the IC die includes flip chip mounting the IC die to the patterned conductive layer.

14. The method of claim 12, wherein mounting the IC die includes wirebond mounting the IC die to the patterned conductive layer.

15. The method of claim 11, comprising:
laminating a patterned conductive layer on the first side of the dielectric substrate; and
wherein forming the plurality of conductive regions includes coating the patterned conductive layer with a solder mask such that plurality of conductive regions are exposed areas not covered by the solder mask.

16. The method of claim 11, wherein the plurality of conductive regions are configured for one of: ball grid array mounting or land grid array mounting.

17. A buck converter comprising:
a dielectric substrate having a first side and a second side;
a high side metal-oxide-semiconductor field-effect transistor (MOSFET) die embedded in the dielectric substrate;
a low side MOSFET die embedded in the dielectric substrate, the low side MOSFET adjacent to the high side MOSFET;
a first patterned conductive layer on the first side of the dielectric substrate, wherein the high side MOSFET die and the low side MOSFET die are coupled to the first patterned conductive layer;
a second patterned conductive layer on the second side of the dielectric substrate, wherein the high side MOSFET die and the low side MOSFET die are coupled to the second patterned conductive layer;
a plurality of through hole vias, at least one through hole via coupled to the first patterned conductive layer and at least one through hole via coupled to the second patterned conductive layer;
an integrated circuit (IC) die, having a top and a bottom, mounted on the first side of the dielectric substrate and coupled to the first patterned conductive layer, the IC die including a controller for the high side MOSFET die and the low side MOSFET die, wherein, in cross section, the IC die at least partially overlaps each of the high-side MOSFET die and low-side MOSFET die;
an electrically insulating material disposed over the top of the IC die and at least a portion of the first side of the dielectric substrate; and
a plurality of conductive regions on the second side of the dielectric substrate for mounting of the dielectric substrate, wherein one of the plurality of conductive regions on the second side of the dielectric substrate is electrically coupled to a source of the high-side MOSFET and to a source of the low-side MOSFET.

18. The buck converter of claim 17, wherein the dielectric substrate includes a prepreg material.

19. The buck converter of claim 17, wherein the IC die is mounted to the one of the first or second patterned conductive layer with a plurality of wires.

20. The buck converter of claim 17, wherein the plurality of conductive regions are configured for one of ball grid array mounting or land grid array mounting to a printed circuit board.

* * * * *